United States Patent [19]

Aviander et al.

[11] 4,275,356

[45] Jun. 23, 1981

[54] DIGITAL TIME DEPENDENT RELAY CIRCUITRY

[75] Inventors: Stig Aviander; Curt Jacobsson, both of Vesteras, Sweden

[73] Assignee: ASEA Aktiebolag, Vesteras, Sweden

[21] Appl. No.: 9,766

[22] Filed: Feb. 6, 1979

[30] Foreign Application Priority Data

Feb. 9, 1978 [SE] Sweden ............................ 7801510

[51] Int. Cl.[3] ........................................ H03K 17/28

[52] U.S. Cl. ................................ 328/129; 307/597

[58] Field of Search ........................... 328/129, 130

[56] References Cited

U.S. PATENT DOCUMENTS

| | | | |
|---|---|---|---|
| 3,579,126 | 5/1971 | Paul | 328/129 |
| 3,668,529 | 6/1972 | Meyer | 328/129 |
| 3,693,098 | 9/1972 | Sevilla | 328/130 |
| 3,725,794 | 4/1973 | Asplund | 328/129 |
| 4,025,868 | 5/1977 | Miki et al. | 328/129 X |
| 4,186,298 | 1/1980 | Kinbara | 328/129 X |

*Primary Examiner*—John S. Heyman

*Attorney, Agent, or Firm*—Watson, Cole, Grindle & Watson

[57] ABSTRACT

A digital time dependent relay is constructed for long time-lags and converts an incoming current signal into a binary number (n). The relay comprises one or more binarily controlled frequency multipliers, such as a Binary Rate Multiplier, or Decade Rate Multiplier, the control signal of which consists of the binary number and an input frequency which is determined by an adjustable oscillator and occurs when the incoming input signal exceeds a predetermined level. The output frequency of the multiplier is supplied to a binary counter which delivers an output signal when its contents reach a predetermined value. By a series-connection of two or more multipliers, an output frequency is achieved which is proportional to a second or higher power of the binary number and thus to the same power of the incoming current signal. The desired time-lag is determined by the frequency of the oscillator, by the control signal to the multiplier, and by the predetermined value of the counter.

3 Claims, 1 Drawing Figure

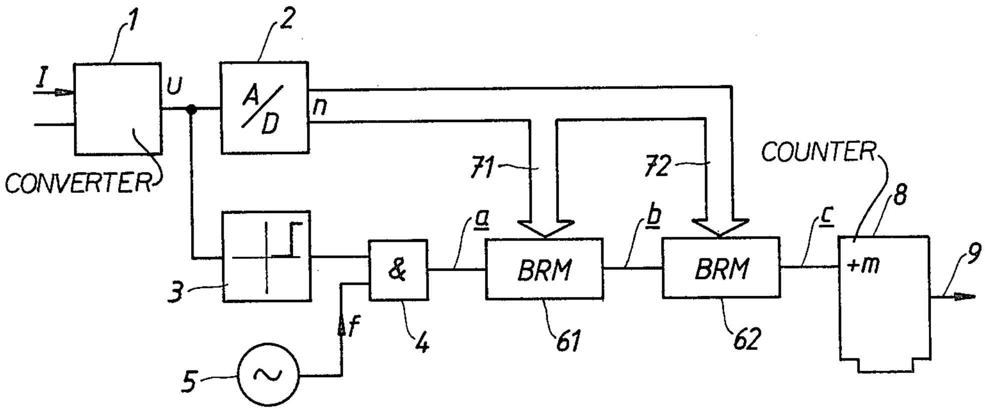
1
2
I
U
A/D
n
CONVERTER
71
72
COUNTER
8
a
b
c
&
BRM
BRM
+m
9
3
f
4
61
62
5

DIGITAL TIME DEPENDENT RELAY CIRCUITRY

BACKGROUND

1. Field of the Invention

The present invention relates to digital time dependent relay circuitry constructed to achieve long delay times.

2. Prior Art

Prior art time dependent relays built with analog components have the disadvantage of not being able to achieve long time-lags because of leakage currents in components with high resistance and capacitance values. This is particularly pronounced when the current is included in the second or a higher power since non-linear circuits are then required. Also the deviation between the longest and the shortest time becomes limited.

SUMMARY OF THE INVENTION

The limitations mentioned above do not occur in a relay according to the present invention. The relay has a timing circuit, the operation of which is based on generation of pulses in dependence on an existing input signal as well as counting of a specified number of pulses before a tripping signal is obtained. The pulse generation takes place by means of one or more binarily controlled frequency multipliers of the Binary Rate Multiplier type, generally designated BRM, or Decade Rate Multiplier, designated DRM. An input frequency signal occurs only when the monitored current exceeds a specified value and has a specified but adjustable frequency. The multiplier is controlled by a binary number corresponding to the value of the monitored current. The output frequency of the multiplier is supplied to a binary counter, which is set to emit an output signal when its contents reach a predetermined value. The desired time-lag of the timing circuit is thus determined by the frequency of the input signal as well as by the setting of the counter.

BRIEF DESCRIPTION OF THE FIGURE

The accompanying drawing shows a diagram of a relay according to the invention.

DETAILED DESCRIPTION

An input signal I, which is dependent on the incoming quantity to be monitored by the relay, is converted in current-voltage convertor 1 into a corresponding voltage U. This voltage is converted by analog/digital converter 2 into a binary number n, which may consist, for example, of four binary digits. The voltage U is also supplied to level detector 3, which delivers an output signal to one input of AND-gate 4 when the measuring signal I exceeds a certain, adjustable value. Oscillator 5 is adapted to deliver a signal with a specified but adjustable frequency f, and this signal is supplied to the second input of AND-gate 4. Thus, a signal a with the frequency f occurs at the output of AND-gate 4 when the level of voltage U, which is set by level detector 3, is exceeded.

The timing circuit of the relay comprises at least one, but preferably two or more, binarily controlled frequency multipliers 61, 62. These are of the Binary Rate Multiplier Type, called BRM, or Decade Rate Multiplier Type, called DRM. A 4-bit multiplier of this type delivers an output pulse frequency which is the input pulse frequency multiplied by 1/16 of the binary number which is supplied to the multiplier as a control signal and which in the present case is dependent on the current I. In the FIGURE the control of multipliers 61, 62 is indicated by arrows 71 and 72. Signal a at the input of multiplier 61 has, according to the above, a constant frequency f. Signal b, which occurs at the output of multiplier 61, has the frequency $(f \cdot n/k)$, where k is a quantity specified for the multiplier, which in a 4-bit BRM-multiplier is 16 and for a DRM multiplier is 10. If the binary number n is assumed to be 7, the frequency of signal b will thus be $(f \cdot 7/16)$ for a BRM and $(f \cdot 7/10)$ for a DRM.

If, as the FIGURE shows, a second multiplier 62 is connected in series with the first multiplier 61, a signal c will be obtained at the output of the second multiplier with the frequency $f \cdot (n^2/k^2)$, provided that both multipliers are equal. With the mentioned values of n and k inserted, the frequency of signal $c = (f \cdot 49/256)$.

With two series-connected mulipliers in the timing circuit, there will be a square relation between the input signal n and the frequency of the output signal c at an unchanged value of f.

By cascade connection of a number of 4-bit multiplier quantities within each multiplier 61 and 62, respectively, there is obtained a multiplier having several bits and therefore a considerably better resolution of the measurement value of the quantity to be monitored. The cascade connection is performed in a manner conventional for these multiplier units. Through the cascade connection, multipliers 61 and 62 receive a larger number of bits and consequently A/D convertor 2 must be adapted to the multipliers in this respect.

The output frequency c is fed into a binary counter 8 of a conventional construction. When the counter reaches a predetermined content, it delivers an output signal at the output 9 of the counter.

The time that is to pass from the start of the timing circuit until the counter 8 delivers an output signal can be extended either by increasing the number of pulses to be counted by the counter before it delivers an output signal, or by setting the frequency f from oscillator 5 at a lower value, or by a combination of these two measures.

What is claimed is:

1. Time dependent relay circuitry comprising means for converting an incoming measurement signal into a binary number corresponding thereto; means for generating an input signal with a predetermined frequency when the measurement signal exceeds a predetermined value; a timing circuit including at least one binarily controlled frequency multiplier, the control signal of which consists of said binary number, and the input frequency of which is determined by said input signal; and a binary counter responsive to the output frequency of said frequency multiplier and adapted to deliver an output signal when the contents of said binary counter reach a predetermined value.

2. Circuitry according to claim 1, wherein said timing circuit further includes two or more series-connected binarily controlled frequency multipliers, whereby said output frequency becomes proportional to a second or higher power of the binary number.

3. Circuitry according to claim 1 or 2, wherein each of said frequency multipliers is a cascade connection of two or more multiplier circuits.

* * * * *